US009532465B2

(12) United States Patent
Vesce et al.

(10) Patent No.: US 9,532,465 B2
(45) Date of Patent: Dec. 27, 2016

(54) METHOD OF FABRICATING A PRINTED CIRCUIT BOARD INTERCONNECT ASSEMBLY

(71) Applicant: TTM Technologies, Inc., Santa Ana, CA (US)

(72) Inventors: John Vesce, Somers, CT (US); Joseph William Heery, Jr., Tolland, CT (US)

( * ) Notice: Subject to any disclaimer, the term of this patent is extended or adjusted under 35 U.S.C. 154(b) by 93 days.

(21) Appl. No.: 13/852,947

(22) Filed: Mar. 28, 2013

(65) Prior Publication Data

US 2013/0269183 A1 Oct. 17, 2013

Related U.S. Application Data

(60) Provisional application No. 61/616,905, filed on Mar. 28, 2012.

(51) Int. Cl.
*H05K 3/20* (2006.01)
*H05K 3/36* (2006.01)
*H05K 3/46* (2006.01)
*H05K 1/02* (2006.01)
*H05K 3/42* (2006.01)

(52) U.S. Cl.
CPC .............. *H05K 3/36* (2013.01); *H05K 3/4623* (2013.01); *H05K 3/4638* (2013.01); *H05K 1/0269* (2013.01); *H05K 3/368* (2013.01); *H05K 3/429* (2013.01); *H05K 3/4691* (2013.01); *H05K 2201/09063* (2013.01); *H05K 2203/061* (2013.01); *H05K 2203/063* (2013.01); *H05K 2203/167* (2013.01); *Y10T 29/49126* (2015.01)

(58) Field of Classification Search
USPC ................... 29/830, 831, 846, 854
See application file for complete search history.

(56) References Cited

U.S. PATENT DOCUMENTS

| 5,268,064 | A | * | 12/1993 | Woo et al. ............... 216/20 |
| 5,403,869 | A | * | 4/1995 | Arike et al. ............ 522/25 |
| 5,622,588 | A | * | 4/1997 | Weber .................... 156/263 |
| 5,625,166 | A | * | 4/1997 | Natarajan ............ 174/557 |
| 5,650,593 | A | * | 7/1997 | McMillan et al. ..... 174/542 |
| 6,048,430 | A | * | 4/2000 | Johnston ............... 156/233 |
| 6,121,553 | A | * | 9/2000 | Shinada et al. ........ 174/259 |
| 7,122,746 | B2 | | 10/2006 | Higuchi et al. |
| 7,721,427 | B2 | | 5/2010 | Enomoto et al. |
| 8,188,373 | B2 | * | 5/2012 | Hunrath ................ 174/257 |
| 8,291,584 | B2 | * | 10/2012 | Tanaka ................... 29/841 |
| 8,567,053 | B2 | | 10/2013 | Kumar et al. |
| 2001/0029065 | A1 | | 10/2001 | Fischer et al. |
| 2007/0246254 | A1 | | 10/2007 | Kumar et al. |
| 2008/0079120 | A1 | | 4/2008 | Foster et al. |
| 2008/0251495 | A1 | | 10/2008 | Cheng et al. |

OTHER PUBLICATIONS

International Search Report and Written Opinion for International Application No. PCT/US2011/039171, dated Sep. 27, 2011; 8 pgs.

* cited by examiner

*Primary Examiner* — Paul D Kim

(57) ABSTRACT

The invention provides a method of fabricating an interconnect comprising aligning and stacking a plurality of printed circuit boards with at least one adhesive component, laminating the printed circuit boards and the adhesive component, preparing bonded pair holes, depositing a copper seed layer, forming a copper plate image, electroplating a copper layer, removing a plate resist and depositing an insulator layer.

1 Claim, 17 Drawing Sheets

SECTION A-A
SCALE 20 : 1

SECTION B-B
SCALE 20 : 1

SECTION C-C
SCALE 20 : 1

SECTION D-D
SCALE 20 : 1

SECTION E-E
SCALE 20 : 1

SECTION F-F
SCALE 20 : 1

SECTION G-G
SCALE 20 : 1

SECTION H-H
SCALE 20 : 1

METHOD OF FABRICATING A PRINTED CIRCUIT BOARD INTERCONNECT ASSEMBLY

CROSS REFERENCE TO RELATED APPLICATION(S)

This application claims priority to U.S. Provisional Patent Application Ser. No. 61/616,905, entitled "PCB to PCB Connector-Less Interconnect," filed on Mar. 28, 2012, the contents of which are incorporated herein by reference in its entirety.

BACKGROUND

A Printed Circuit Board (hereinafter termed "PCB") is a vital element of virtually every electronic consumer device available today including, for example, appliances, toys, handheld devices, computers, and the like. Moreover, PCB technology has been implemented in critical applications such as, for example, medical, telecom, satellite, aerospace, and defense. In general, a PCB mechanically supports and electrically connects electronic components using conductive traces etched from copper sheets laminated into a non-conductive substrate.

There are presently four basic types of PCBs, which include rigid boards, flexible boards, rigid flex boards, and Microwave/RF boards. Moreover, PCBs may be single-sided, double-sided, and multilayer. Multilayer configurations include a plurality of layers of copper circuitry, which provides the electrical contact for proper functionality.

As applications have grown in sophistication, PCBs have followed suit. In order to maintain a smaller footprint, for example, PCBs may be stacked with adequate electrical connections existing between the stacked PCBs. PCBs are typically connected to other PCBs using an electrical connector. A wide variety of electrical connectors exist for the purpose of providing a highly reliable interconnect between PCBs. High reliability is critical, as any misconnection may cause a failure to occur within a system. Furthermore, a system failure on an end application may have catastrophic consequences, resulting in major financial losses and, more significantly, the loss of life.

Prior art PCB connector applications consist of the following example techniques. The following descriptions represent the more common generic approaches commercially available for highly reliable applications. However, the descriptions of the prior art do not include all generic approaches available. The following descriptions of the prior art are presented only to provide a perspective, which may help the reader to better understand and appreciate the inventor's unique connector and approach for connecting PCBs, which is presented herein.

Soldered Pin in Hole: This technology comprises installation of a pin within a plated through hole on a PCB. Once installed, the pin is soldered to provide both the mechanical and electrical connection between the connector and the PCB.

Double-Eye Compliant Pin: A compliant pin provides a press-fit connection between a printed circuit board plated through hole and the connector pin. The connection is made by pressing an over-sized pin into the drilled thru-hole of the PCB. The cross section of the pin is greater than the diameter of the hole and the compliant pin compresses and conforms to the barrel of the plated though hole within the PCB. The compliant pin forces against the hole wall to provide both the mechanical and electrical connection between the connector and the PCB.

A single compliant pin is used to make contact within one PCB, while a double compliant pin is used to connect two PCBs.

Pin/Socket: A pin, which can be un-insulated or insulated with a polymer material, may provide the interface between two PCBs. The plated thru-holes on the opposing PCBs contain a socket, which is press-fit into the holes and provide electrical contact to the PCB. The socket contains a bifurcated section which will provide electrical contact to the mating pin.

Compression: Compression mount style connectors are Z-Axis connector elements that are squeezed between two boards to achieve electrical contact. The connector is typically made up of a beryllium copper or silver filled elastomeric polymer on a rigid polymer carrier. The carrier interconnect is positioned between two components with matching connection footprints. The two components are compressed and fastened together.

Surface mount: A surface mount connector is soldered to exposed pads on the surface of a PCB. Two mating (opposite gender) connectors may each be placed on two horizontally opposing PCBs, such that when mated, will provide electrical connection between the two PCBs.

Conductive Ink: A method for establishing an electrical vertical Z-axis connection through the use of conductive pastes. Typical metal pastes that are commercially available create a permanent metal post within a PCB. During the melt stage of the paste, the composition undergoes a sintering process to permanently bond to the adjacent contact pads, thereby creating a contact. This approach may be implemented internally within a PCB to make vertical connections or externally for a PCB to PCB connection.

While each of the above described methodologies and techniques include inherent advantages and disadvantages, the development of such varied techniques demonstrates a need for a repeatable, efficient, and reliable process for constructing PCB interconnects, wherein the integrity of the conductive connections must be maintained. As such, there is a need for an efficient method for bonding PCBs while ensuring that the interconnects between the two individual PCBs are maintained.

SUMMARY

Some embodiments of the invention provide a method of fabricating an interconnect comprising aligning and stacking a plurality of printed circuit boards with at least one adhesive component, laminating the printed circuit boards and the adhesive component, preparing bonded pair holes, depositing a copper seed layer, forming a copper plate image, electroplating a copper layer, removing a plate resist and depositing an insulator layer.

Some embodiments provide an interconnect comprising a laminate of an aligned and stacked plurality of printed circuit boards and an adhesive component.

DESCRIPTION OF THE DRAWINGS

The embodiments are illustrated by way of example and not limitation in the figures of the accompanying drawings in which like references indicate similar elements.

DETAILED DESCRIPTION

Figure 1:
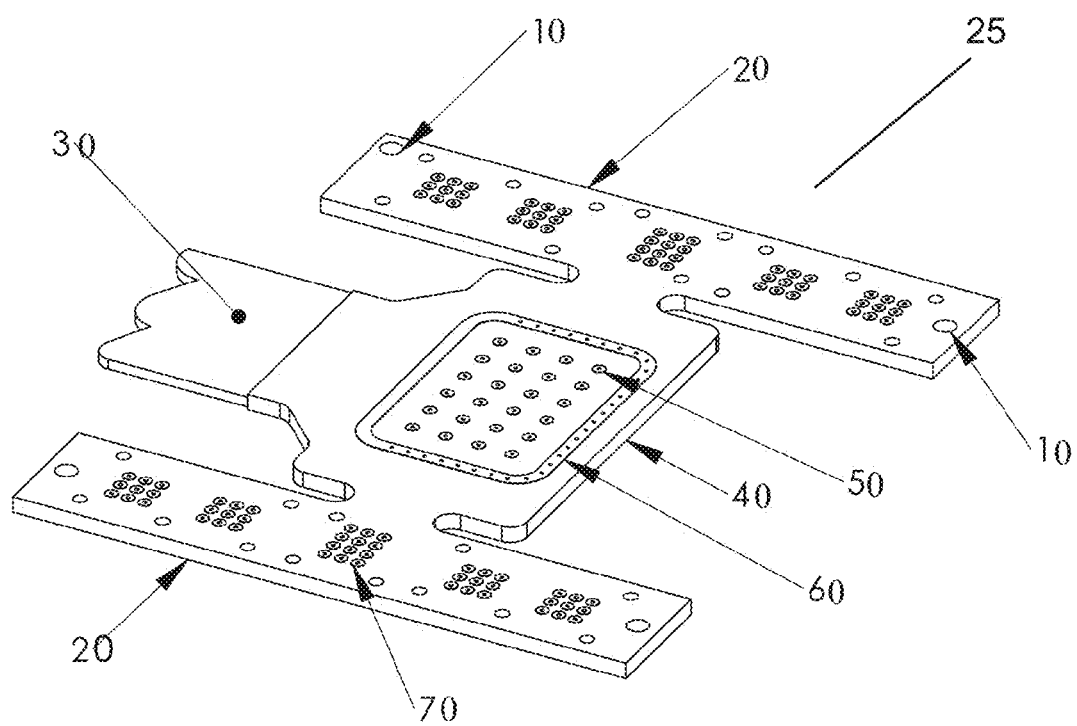
FIG. 1 is a top-side perspective of a completed PCB in accordance with one embodiment of the invention.

Before any embodiments of the invention are explained in detail, it is to be understood that the invention is not limited in its application to the details of construction and the arrangement of components set forth in the following description or illustrated in the following drawings. The invention is capable of other embodiments and of being practiced or of being carried out in various ways. Also, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items. Unless specified or limited otherwise, the terms "mounted," "connected," "supported," and "coupled" and variations thereof are used broadly and encompass both direct and indirect mountings, connections, supports, and couplings. Further, "connected" and "coupled" are not restricted to physical or mechanical connections or couplings.

The following disclosure is presented to enable a person skilled in the art to make and use embodiments of the invention. Various modifications to the illustrated embodiments will be readily apparent to those skilled in the art, and the generic principles herein can be applied to other embodiments and applications without departing from embodiments of the invention. Thus, embodiments of the invention are not intended to be limited to embodiments shown, but are to be accorded the widest scope consistent with the principles and features disclosed herein. The following detailed description is to be read with reference to the figures, in which like elements in different figures have like reference numerals. The figures, which are not necessarily to scale, depict selected embodiments and are not intended to limit the scope of embodiments of the invention. Skilled artisans will recognize the examples provided herein have many useful alternatives that fall within the scope of embodiments of the invention.

In general, some embodiments of the disclosed PCB interconnect assembly 270 include methods to physically bond a first PCB 25a and second PCB 25b, while achieving continuous conductive interconnects between the bonded boards PCB 25a, 25b within the PCB interconnect assembly 270. As used herein, a PCB 25 is individually fabricated to completion by way of various methodologies that are known in the art and consistent with industry standard PCB fabrication techniques. Under normal circumstances, a completed PCB 25 is removed from a manufacturing panel, and electrically tested to the required performance specification. For example, in some embodiments, the PCB 25 can be inspected against industry PCB specifications such as, for example, IPC 6012, 6013, 6018 and/or A600.

Figure 2:
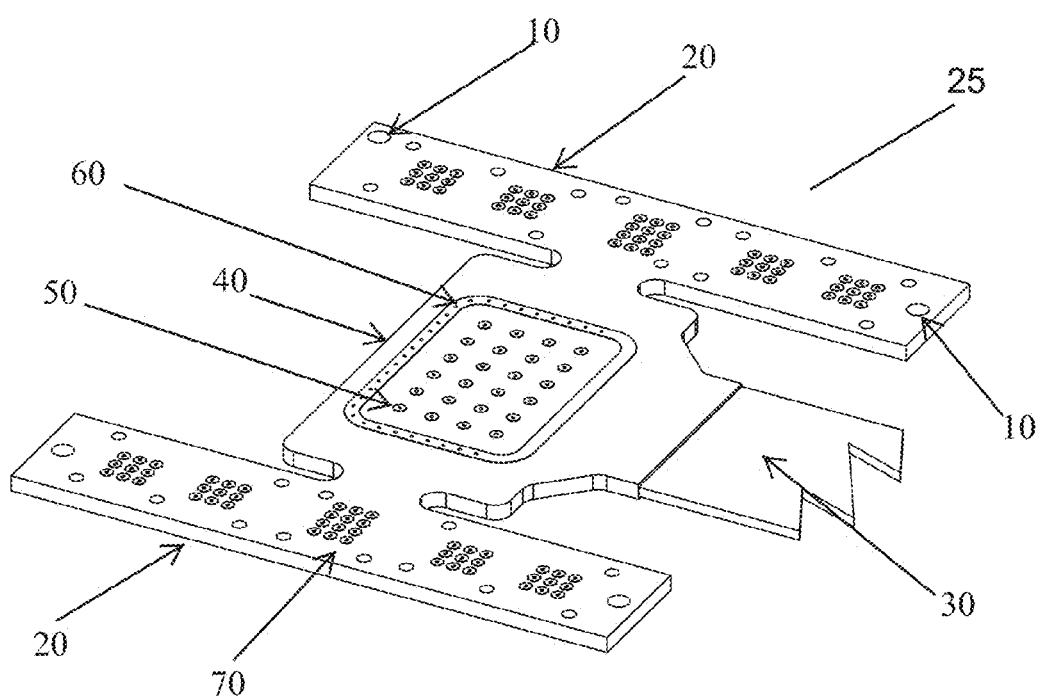
FIG. 2 is bottom-side perspective of a completed PCB in accordance with one embodiment of the invention.

FIG. 1 is a top-side perspective of a completed PCB 25 in accordance with one embodiment of the invention. The illustrated PCB 25 may be constructed of a variety of materials including glass, cotton, paper, and polyester. In some embodiments, a combination of these materials is bound by an epoxy, polyimide, or other type of resin system to create a durable and non-conductive substrate. FIG. 2 is bottom-side perspective of a completed PCB 25 in accordance with one embodiment of the invention. Specifically, FIG. 2 provides an additional view of the components discussed above in reference to FIG. 1 including, alignment holes 10, conformance coupon areas 20, flex PCB 30 region, rigid regions 40, through-hole region 50, ground ring 60, and conformance coupon through-holes 70.

Figure 3A:
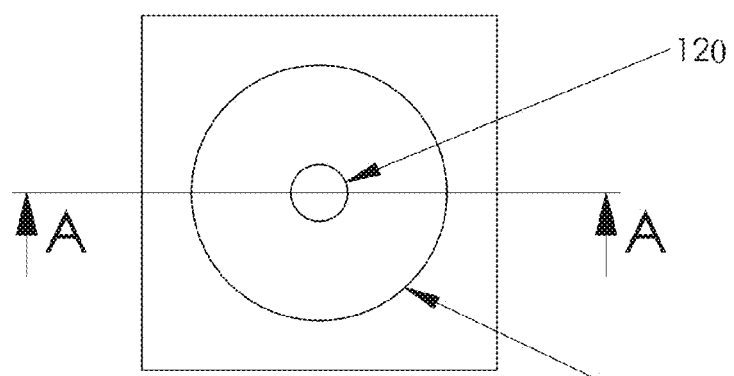
FIG. 3A is an illustration of a perspective view representing a top side or a bottom side of a PCB prior to bonding in accordance with one embodiment of the invention.
Figure 3B:
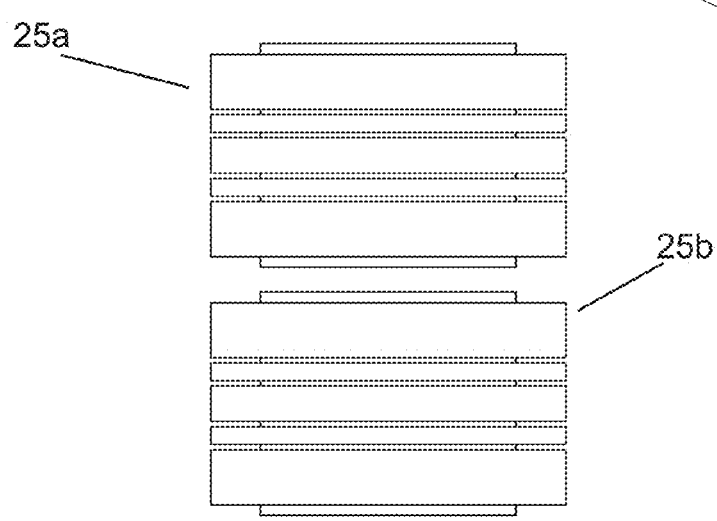
FIG. 3B is a side perspective view of a PCB prior to bonding in accordance with one embodiment of the invention.
Figure 3C:
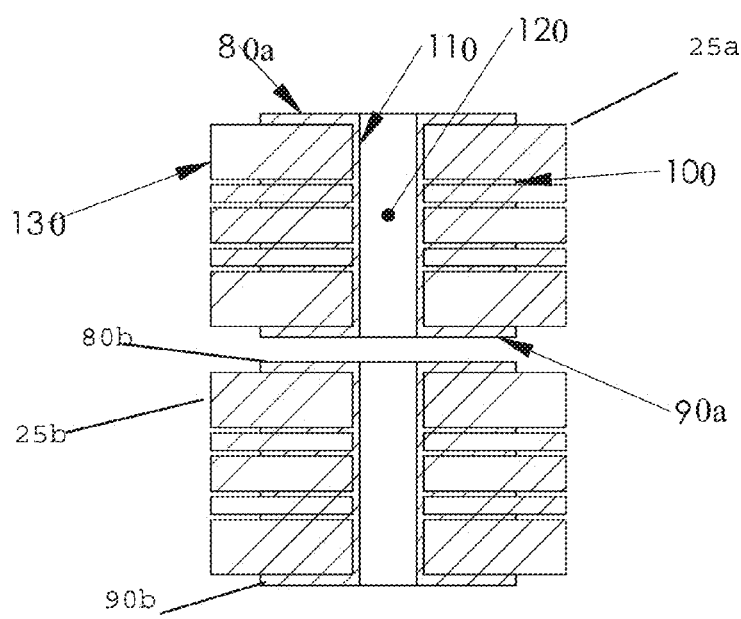
FIG. 3C is a side sectional perspective of an individual top-side and a individual bottom-side PCB prior to bonding in accordance with one embodiment of the invention.

FIG. 3A is an illustration of a perspective view representing a top side or a bottom side of a PCB 25a, 25b prior to bonding in accordance with one embodiment of the invention. As further illustrated in FIG. 3B showing a side perspective view of a PCB 25a, 25b prior to bonding, and FIG. 3C showing a side sectional perspective of an individual top-side PCB 25a and individual bottom-side PCB 25b prior to bonding, the plated through hole 120 is centered within the top-side pad 80a, and the plated through hole 120 extends vertically through the various layers, including the bottom-side pad 90a of the top-side PCB 25a. Further, the plated through hole 120 further extends vertically through the bottom-side PCB 25b, including the top-side pad 80b of the bottom-side PCB 25b, the conductive 100 and insulating layers 130 of the bottom-side PCB 25b, and the bottom-side pad 90b of the bottom-side PCB 25b. In one embodiment, the plated through hole 120 includes a copper plating 110 with a thickness of 0.001 inches. As shown in FIG. 3C, in one embodiment, both the top-side PCB 25a and the bottom-side PCB 25b comprise a plurality of laminated layers 100, 130, including at least one dielectric insulator 130, and further including at least one conductive inner layer 100.

In some embodiments, following fabrication and testing, individual PCBs 25a, 25b are ready to be connected. For example, in some embodiments, individual PCBs 25a, 25b can be connected using the process 5 illustrated in FIG. 17. In some embodiments, the individual PCBs 25a, 25b can be drilled and copper plated, such that the diameter of the drilled hole 200 is less than the pin diameters corresponding to the various parts which will be used in the final PCB 25a to PCB 25b connection. The smaller hole diameter allows for each part to be electrically tested and accepted prior to the PCB 25a to PCB 25b connection operation.

In some embodiments, at the beginning of a design stage, a PCB 25 includes common tooling holes, known as "alignment holes". The PCB 25 may include any number of tooling alignment holes 10. In general, the alignment holes 10 comprise through holes 10 in the circuit board that is used for positioning purposes. For example, an alignment hole 10 might be used during circuit fabrication to align a panel include at least one PCB 25 with the artwork. More specifically, and in the context of this application, the alignment hole 10 may be used to precisely align two circuit boards 25a, 25b that are to be bound together. The alignment holes 10 allow each separate PCB 25a to accurately align with a mating PCB 25b. In one embodiment, conformance verification coupons 20 are attached to the mating area. The conformance verification coupon may be used for final PCB 25 certification to industry specifications such as IPC 6012, 6013, 6018 and/or A600. The conformance verification coupon may be removed at the end of the fabrication process.

Some embodiments of the PCB 25 may include any number of conformance coupon areas 20. In general, a coupon 20 is used to evaluate the structural integrity of the PCB 25 and its conformance to an industry specification such as IPC 6012, 6013, 6018 and/or A600.

Some embodiments can provide a circuit that is printed on a flexible substrate to produce a flex PCB region 30. The flex PCB 30 region allows for movement of the PCB 25 in order to accommodate a connection between two rigid regions 40 of the PCBs or bending for final installation without stressing the rigid regions 40.

In one embodiment, the connector includes a plated through-hole region 50 of the PCB 25. These holes 50 are for the electrical connection of the internal and outer layers per the electrical design of the PCB 25. In some embodiments, the holes 50 will eventually be re-drilled and used as the means of electrically connecting the internal and outer layers of the first and second PCBs 25a, 25b together (forming for example the through hole 200 shown in FIG. 7C). Those of ordinary skill in the art will appreciate that the through-hole region 50 may include any number of through-holes, such that an adequate number of connections exist between the first and second PCB 25a, 25b. In one embodiment, the PCB 25 may also include plated through holes 70 of the conformance coupon area 20.

In one embodiment, the PCB 25 includes a ground ring 60 that encircles the through-hole region 50. The ground ring 60 may shield the through-hole region 50 from outside noise as well as contain some radiated noise from escaping the circuit. In some embodiments, the ground ring 60 may also prevent accidental shorts and provides a ready and known ground for probes during debug/testing.

Figure 17:
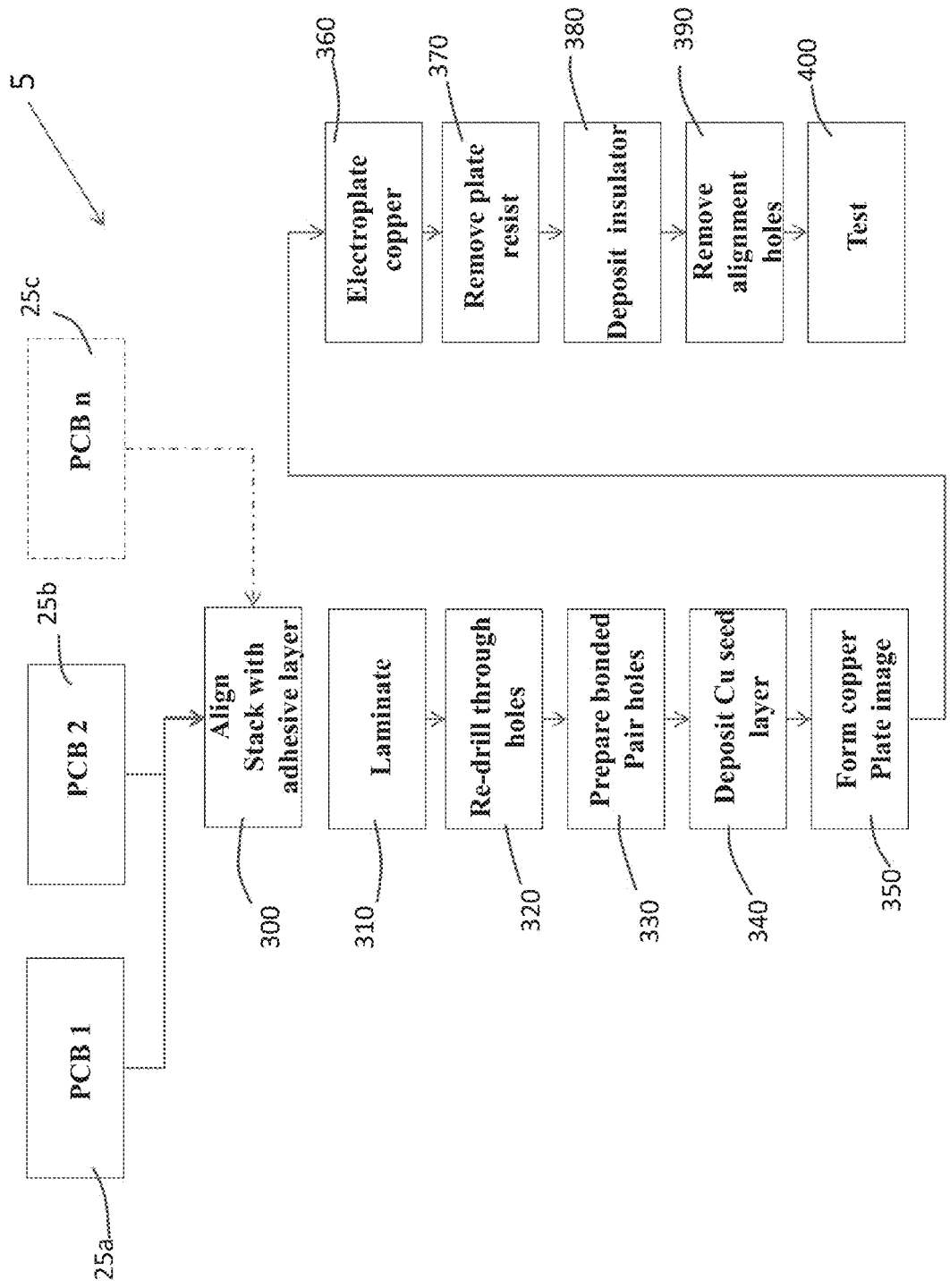
FIG. 17 provides a flow chart illustrating the PCB to PCB connector-less interconnect process in accordance with one embodiment of the invention.

As described earlier, some embodiments of the disclosed PCB interconnect assembly 270 include methods to physically bond a first PCB 25a and second PCB 25b, while achieving continuous conductive interconnects between the bonded boards PCB 25a, 25b within the PCB interconnect assembly 270. The following paragraphs describe the methods to physically bond a first PCB 25a and second PCB 25b within the process 5. Those of ordinary skill in the art will appreciate that the process 5 may comprise greater or fewer steps than those described herein. Also, precise ordering of the described steps may not be critical to the functionality of the disclosed connection process. As such, some steps may be organized differently than as presented herein without creating significantly different results and without departing from the scope of the invention. For example, FIG. 17 provides a flow chart illustrating the PCB 25 to PCB 25 connector-less interconnect process 5 in accordance with one embodiment of the invention. As shown, the process 5 can include a plurality of sub-processes 300, 310, 320, 330, 340, 350, 360, 370, 380, 390, 400. In some embodiments, one or more of the sub-processes 300, 310, 320, 330, 340, 350, 360, 370, 380, 390, 400 can include one or more other sub-processes, and in some other embodiments, other processes or sub-processes may be included before or after one or more of the sub-processes 300, 310, 320, 330, 340, 350, 360, 370, 380, 390, 400. In some embodiments as shown, first and second PCBs 25a, 25b can be included in the process 5, and process within any one of the sub-processes 300, 310, 320, 330, 340, 350, 360, 370, 380, 390, 400. In some other embodiments, optionally, further layers can be included as illustrated by PCB 25c, representing at least one further PCB 25.

In some embodiments, the first PC 25a and second PCB 25b can include at least one surface that comprises an etch resistant finish. For example, in some embodiments, the external metal features (e.g. pads 80a, 90b) on the external layers of the first PCB 25a and second PCB 25b can be at least partially protected with an etch resistant final finish such as, for example, nickel and gold. For example, in some embodiments, the external metal features (e.g. pads 80a, 90b) on the external layers of the first and second PCBs 25a, 25b can include a gold layer coupled to a nickel adhesion layer. In some alternative embodiments, other combinations of etch resistant layers can be used, including, but not limited to for example, nichrome, titanium, tungsten, palladium, gold-palladium.

Figure 4:
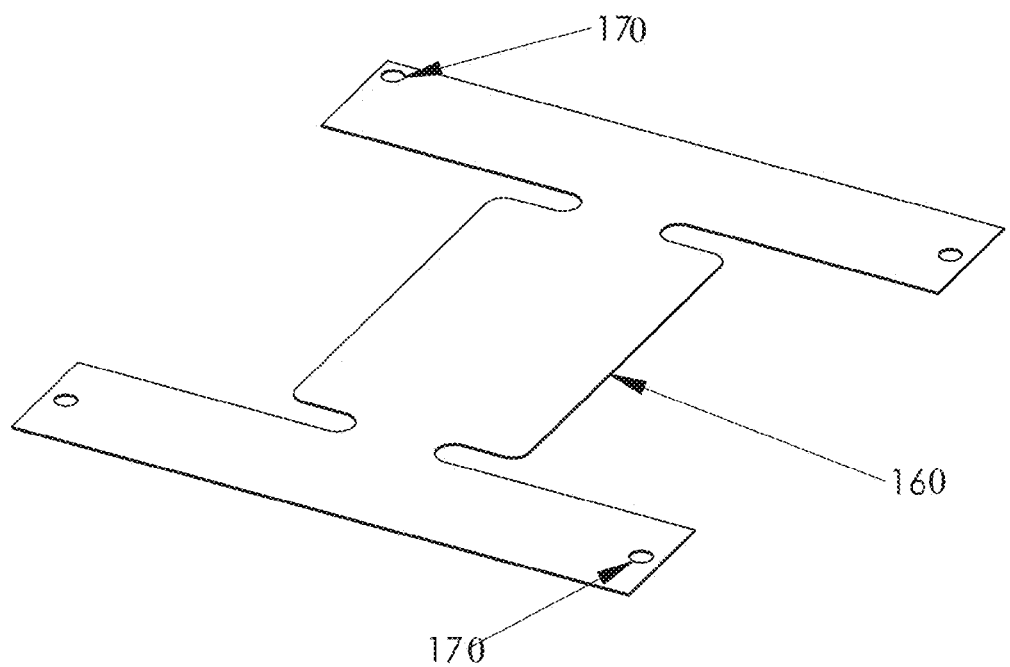
FIG. 4 is a view of a pre-tooled adhesive layer to bond the top-side PCB and bottom PCB together in accordance with one embodiment of the invention.

In one embodiment, the first and second PCBs 25a, 25b can be bonded using a lamination process 310. The first and second PCBs 25a, 25b are stacked and aligned (illustratively represented as a sub-process 300 in FIG. 17) using a fixture with alignment pins to register the two PCBs 25a, 25b. This ensures that the inner layer pads 90a, 80b from the original PCBs 25a, 25b are registered to each other following the bonding process. In some embodiments, the top (first) PCB 25a and the bottom (second) PCB 25b are laminated together using a dielectric insulating adhesive 160 commonly used in bonding PCB 25 layers together. For example, in some embodiments, the adhesives 160 used in the bonding process may include low flow epoxy prepreg, low flow polyimide prepreg, acyclic adhesive, and standard flow prepreg adhesives. More exotic low loss or advance dielectric bonding materials may also be utilized. In some embodiments, the adhesive 160 can be a solid or semi-solid film that is aligned with the first and second PCBs 25a, 25b during the alignment and stack sub-process 300. For example, FIG. 4 is a view of a pre-tooled adhesive layer to bond the top-side PCB 25a and bottom-side PCB 25b together in accordance with one embodiment of the invention. The top-side 25a and bottom-side 25b PCBs are bonded by way of an adhesive layer 160 that is positioned between the top-side PCB 25a and the bottom-side PCB 25b. In one embodiment, the adhesive layer comprises and uncured bonding material adhesive 160 that is precut to the shape and dimensions of the top and/or bottom-side PCBs. As previously described, the top and bottom-side PCBs 25a, 25b include tooled alignment holes 10 to enable accurate alignment of the two PCBs. As such, the adhesive layer can also include tooled alignment holes 170 corresponding with the positioning of the PCB tooled alignment holes 10 in PCB 25a, 25b.

In some other embodiments, the adhesive 160 may be applied as a coating onto the bonding surfaces of the first and second PCBs 25a, 25b. In some embodiments, one or more processes can be used to selectively pattern the first and second PCBs 25a, 25b with the adhesive 160. For example, some embodiments can utilize a conventional screen printing process, a convention spray process, or a conventional spin-on process to selectively deposit the dielectric insulating adhesive 160.

Figure 5A:
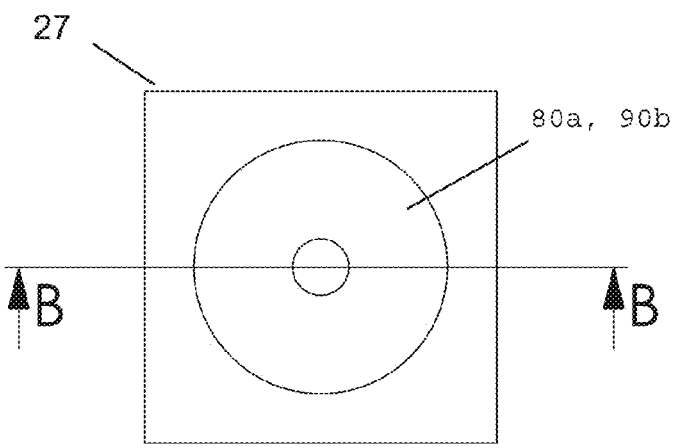
FIG. 5A is an illustration of a perspective view representing a top side or a bottom side of a PCB assembly after bonding in accordance with one embodiment of the invention.
Figure 5B:
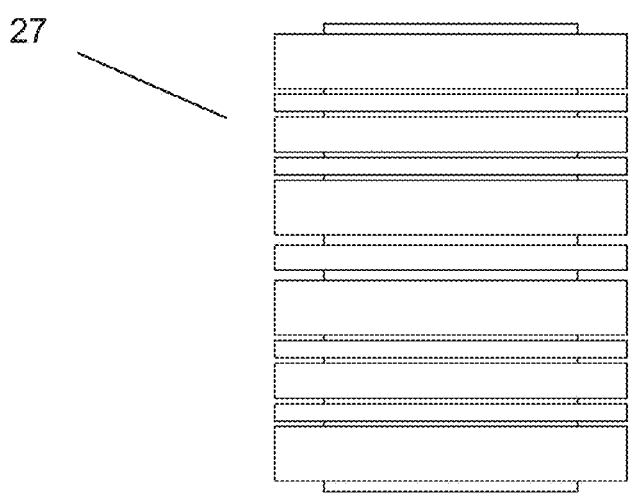
FIG. 5B is a side perspective view of a PCB assembly after bonding in accordance with one embodiment of the invention.
Figure 5C:
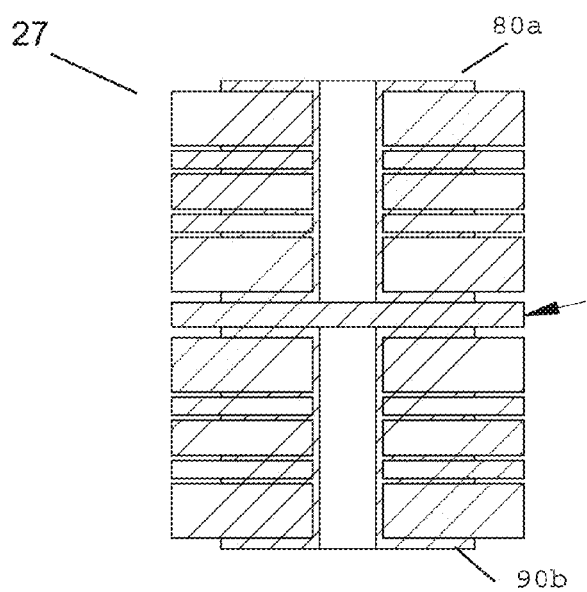
FIG. 5C is a side sectional perspective of a PCB assembly after bonding in accordance with one embodiment of the invention.
Figure 6A:
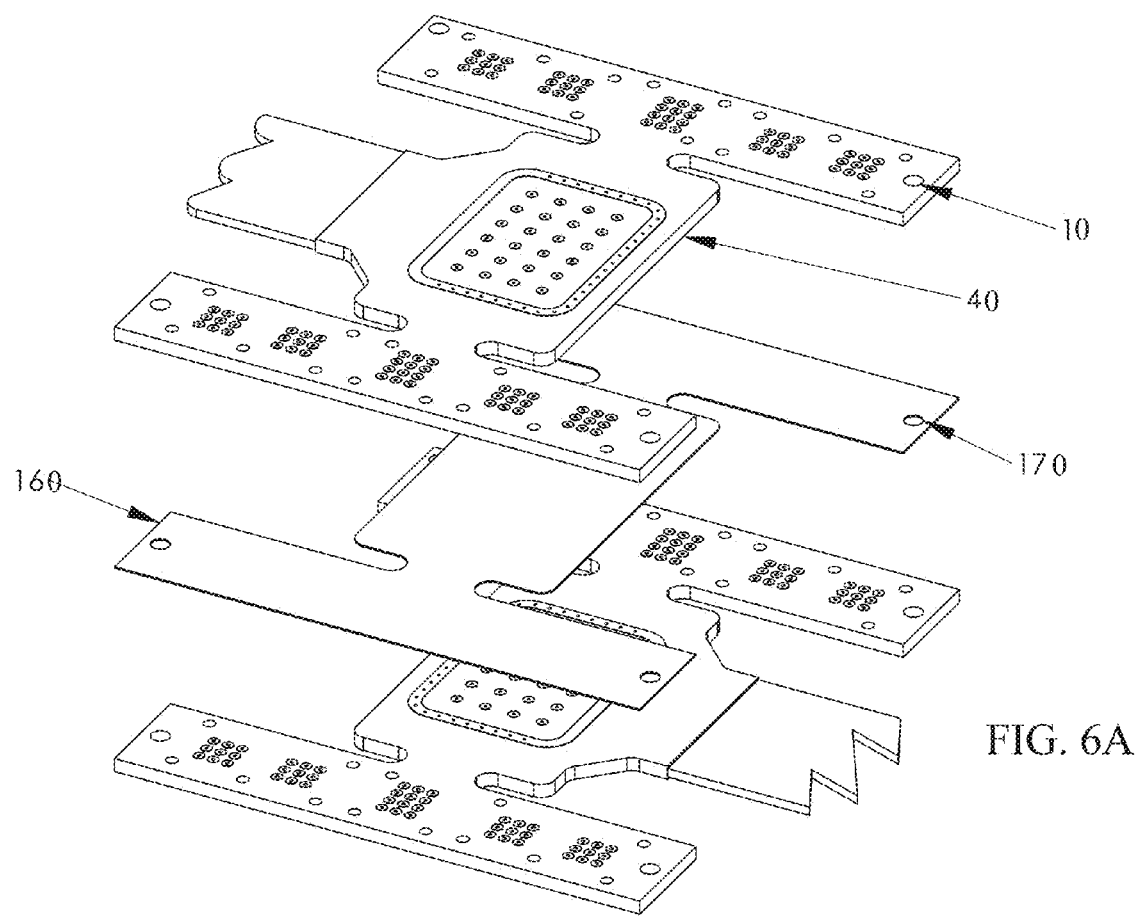
FIG. 6A is an exploded assembly view PCB's prior to bonding in accordance with one embodiment of the invention.
Figure 6B:
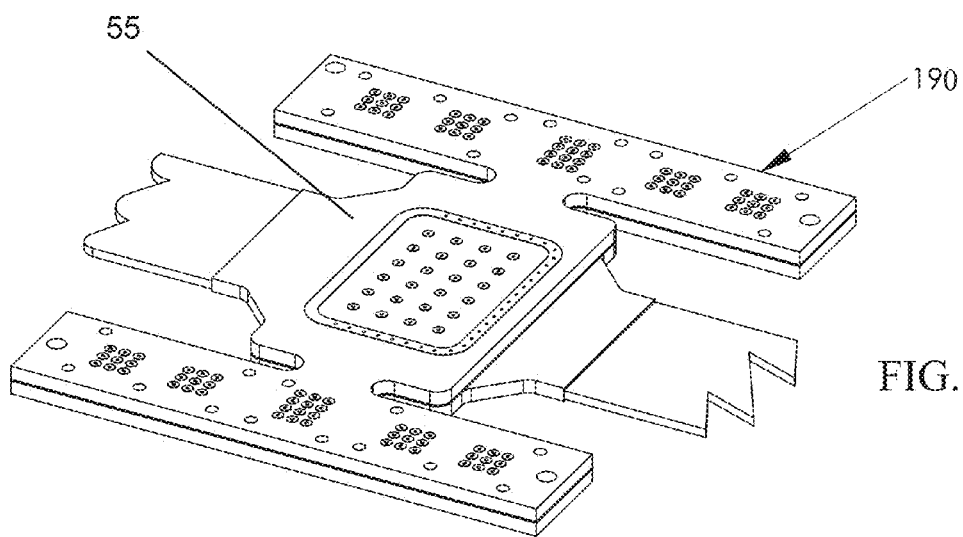
FIG. 6B is a view of the bonded pair of PCB's in accordance with one embodiment of the invention.

In some embodiments, the first and second PCBs 25a, 25b are positioned within a conventional laminating press (not shown) to melt and cure the adhesive 160 within the sub-process 310. An illustration of the stacking assembly can be visualized in FIG. 6A, which shows an exploded assembly view with the bonding material adhesive 160 relative to the various layers of the top-side 25a and bottom-side 25b PCBs prior to bonding in accordance with one embodiment of the invention. The adhesive layer 160 is configured for alignment between the PCBs 25a, 25b. One or more alignment holes 170 ensure an accurate alignment with corresponding alignment holes 10 that are included in the two PCBs 25a, 25b. The alignment and connection of the top-side PCB 25a, adhesive layer 160, and bottom-side PCB 25b results in the final bonded pair PCB 190. In some embodiments, completion of the process 310 can permanently fuse the first and second PCBs 25a, 25b together. The result in the bonded section provides a homogeneous product (for example, a bonded PCB 27 as depicted in FIG. 5B and 5C) consistent with the reliability and construction of a typical multilayer PCB. In some embodiments, completion of the lamination step can produce a PCB assembly with bonded PCBs 25a, 25b including a bonded pair region 55. For example, FIG. 6B is a view of the bonded pair of PCB's 25a, 25b in accordance with one embodiment of the invention.

Figure 7A:
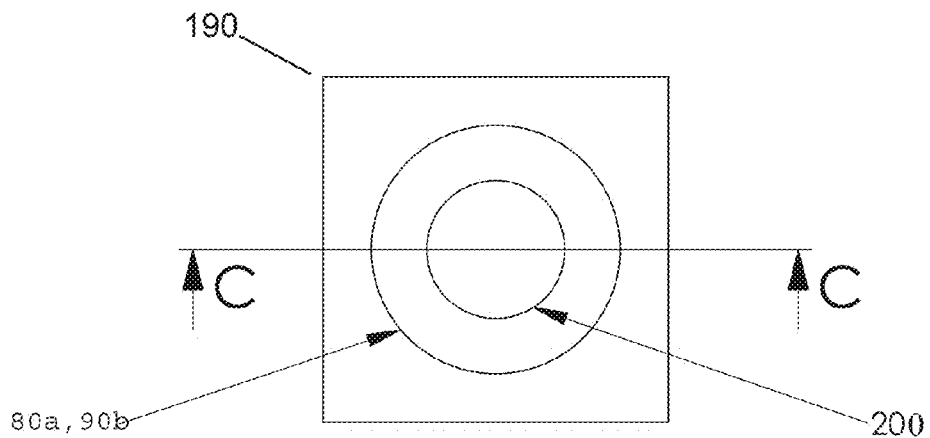
FIG. 7A is an illustration of a perspective view representing a top side or a bottom side of a PCB assembly including drill holes exposing the internal layers of the PCB after bonding in accordance with one embodiment of the invention.
Figure 7B:
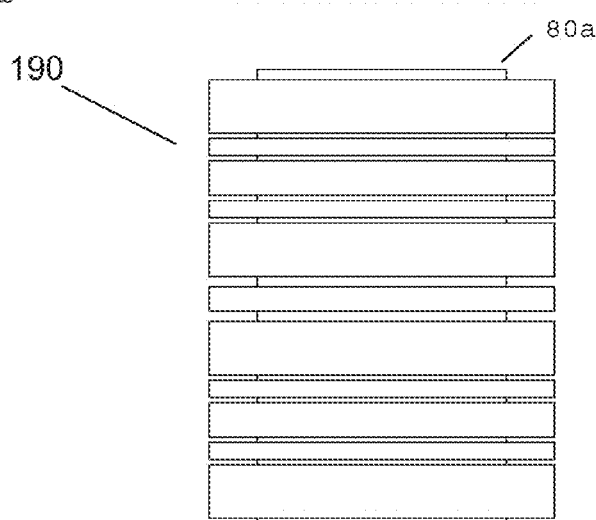
FIG. 7B is a side perspective view of a PCB assembly after bonding including drill holes exposing the internal layers of the PCB in accordance with one embodiment of the invention.
Figure 7C:
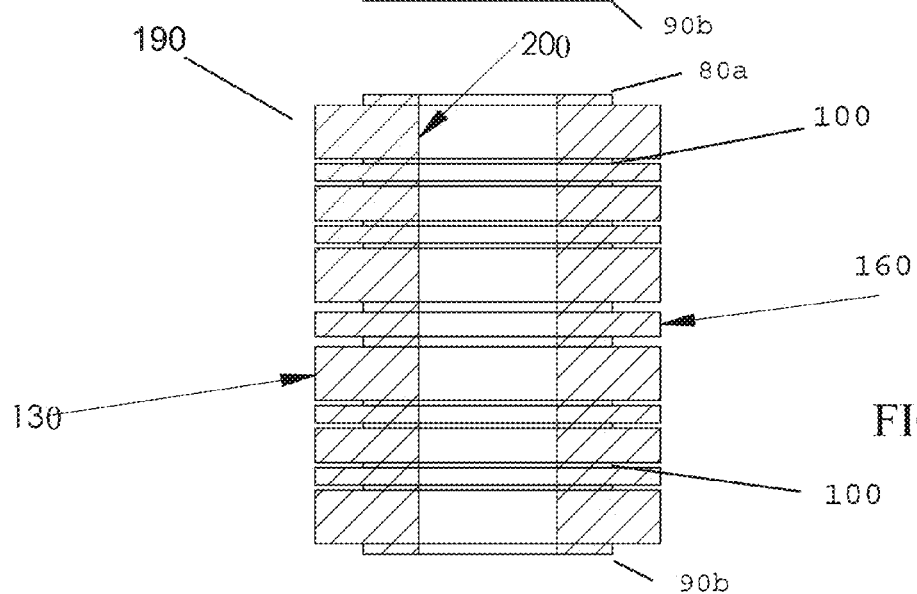
FIG. 7C is a side sectional perspective of a PCB assembly after bonding including drill holes exposing the internal layers of the PCB in accordance with one embodiment of the invention.

Some embodiments of the process 5 can include additional sub-processes. For example, as shown in FIG. 17, the process 5 can include a sub-process 320. For example, in one embodiment, the original plated through holes 50 in the bonded pair region (shown as 55 in FIG. 6B) are re-drilled. The holes 50 are drilled completely through the first and second bonded PCBs 25a, 25b of the bonded PCB 190 forming larger diameter holes 200 (shown for instance in FIGS. 7A and 7C). The formation of holes 200 removes the copper plating that originally coated the internal surfaces of the holes 50. In some embodiments, the newly drilled holes 200 will expose the inner layers 100, 130 that will eventually be coupled through a subsequent copper plating process (shown as sub-process 360 in FIG. 17). For example, FIG. 7A is an illustration of a perspective view representing a top side or a bottom side of a PCB 190 including drill holes 200 exposing the internal layers of the PCB after bonding. FIG. 7B is a side perspective view of a PCB assembly 190 after bonding including drill holes 200 exposing the internal layers 100, 130 of the PCB assembly 190, and FIG. 7C is a side sectional perspective of a PCB assembly 190 after bonding including drill holes 200 exposing the internal layers 100, 130 of the PCB in accordance with one embodiment of the invention. In some embodiments, holes 200 can be formed through the first and second bonded PCBs 25a, 25b of the bonded PCB 190 using a conventional mechanical drill. In other embodiments, the hole may be drilled using a conventional laser drill.

In some embodiments, the process 5 can include a sub-process 330. For example, in one embodiment, the bonded pair holes 200 that were newly drilled in the previous sub-process 320 can be prepared for copper plating. To ensure that the inner layer contacts 100 are free of resin and debris, and other contaminants, a hole 200 preparation step may be implemented. In one embodiment, this may consist of combining plasma and chemical desmearing to clean and texturize the hole 200. In some embodiments, this step may promote adhesion of the copper plating to the inner layer contacts 100 and the walls of the hole 200 defined by the secondary drill size.

Figure 8A:
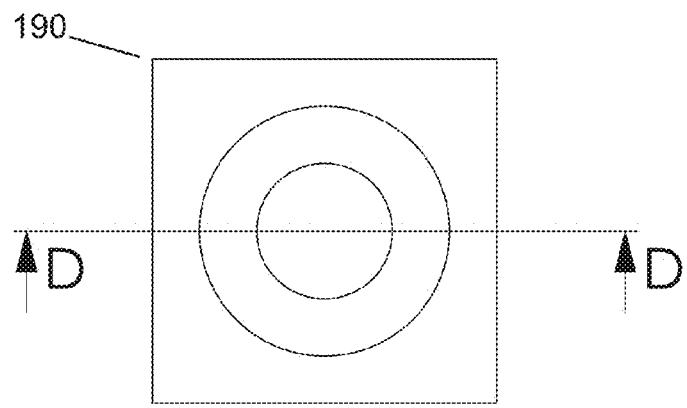
FIG. 8A is an illustration of a perspective view representing a top side or a bottom side of a PCB assembly with conductive seed layer, incorporating an electroless copper or direct metallization process after bonding in accordance with one embodiment of the invention.
Figure 8B:
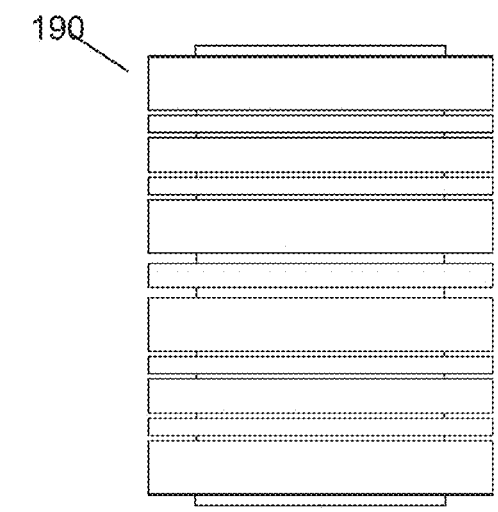
FIG. 8B is a side perspective view of a PCB assembly with conductive seed layer, incorporating an electroless copper or direct metallization process after bonding in accordance with one embodiment of the invention.
Figure 8C:
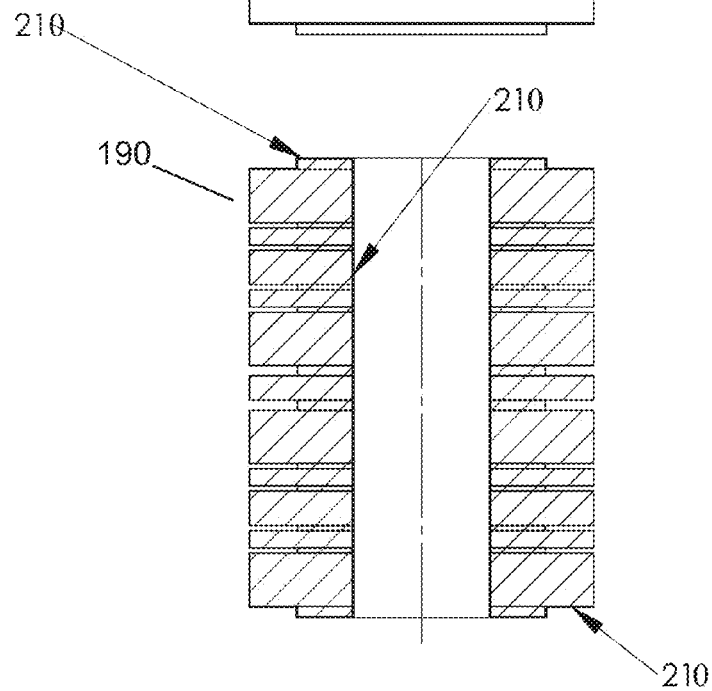
FIG. 8C is a side sectional perspective of a PCB assembly with conductive seed layer, incorporating an electroless copper or direct metallization process after bonding in accordance with one embodiment of the invention.

In some embodiments, the process 5 can include a sub-process 340. In one embodiment, a seed layer of conductive material is provisioned inside the hole 200. The conductive material may comprise electroless copper or any other direct metallization type of process chemistry. This conductive material provides the means for subsequent copper plating that will form the through-hole connection to the inner and external layers of the bonded pair 190. For example, FIG. 8A is an illustration of a perspective view representing a top side or a bottom side of a PCB assembly 190, and FIG. 8B is a side perspective view of a PCB assembly 190 that includes a conductive seed layer 210, incorporating an electroless copper or direct metallization process after bonding in accordance with one embodiment of the invention. This can be illustrated further in FIG. 8C, which shows one embodiment of a PCB assembly 190 showing a side sectional perspective view illustrating the conductive seed layer 210. In general, electroless copper can be used, however one of ordinary skill in the art will recognize that other suitable electroless metal deposition can be used and may include for example, electroless nickel, electroless gold, electroless platinum, electroless palladium, or combinations thereof.

In some embodiments, the process 5 can include a sub-process 350. The sub-process 350 can include creating at least one plating resist layer 220 on at least one surface of each of the external surface layers of the bonded PCB 190. In some embodiments, a plating resist layer 220 is provided on the two external layers of the PCB 190 to allow for a thicker deposit of copper 230 to be plated within the hole barrel 200 of the bonded pair PCB 190. In order to allow copper to be electroplated only in the areas needed, and prevent copper plating in areas where it is not needed, the plating resist layer 220, referred in the industry as a "plating resist", may be applied to the external surface of the bonded area of the PCB as described and shown in FIGS. 9A-9C.

Figure 9A:
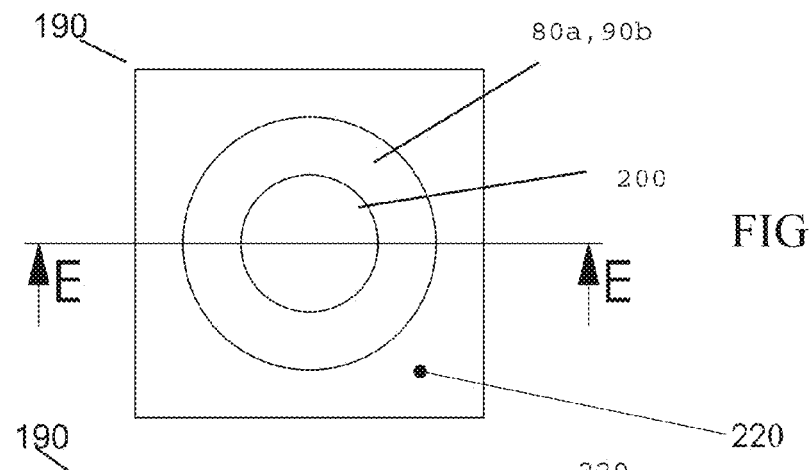
FIG. 9A is an illustration of a perspective view representing a top side or a bottom side of a PCB assembly with an application of plating resist exposing a pad and metalized hole after bonding in accordance with one embodiment of the invention.
Figure 9B:
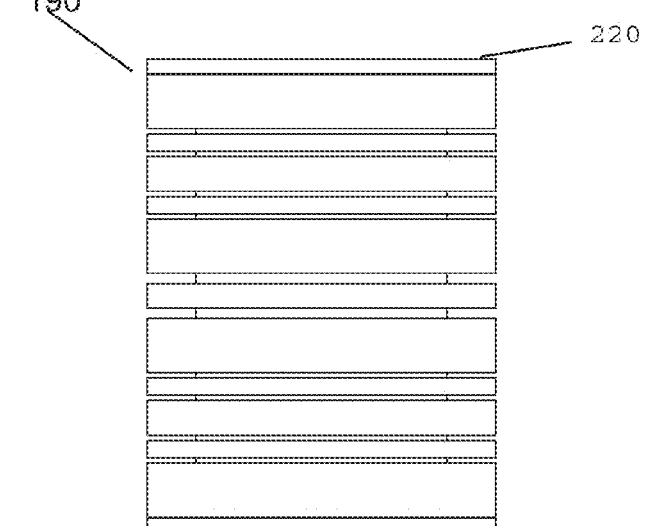
FIG. 9B is a side perspective view of a PCB assembly after bonding with an application of plating resist exposing a pad and metalized hole in accordance with one embodiment of the invention.
Figure 9C:
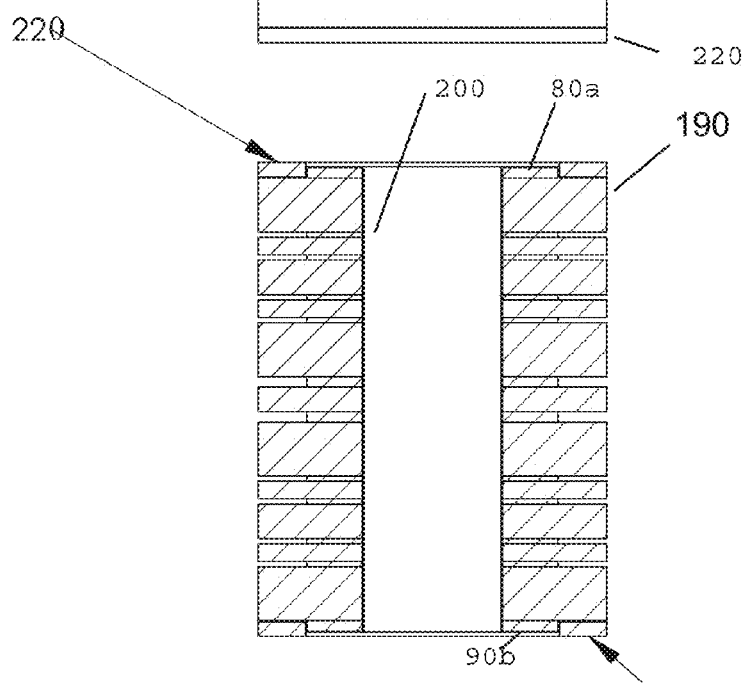
FIG. 9C is a side sectional perspective of a PCB assembly after bonding with an application of plating resist exposing a pad and metalized hole in accordance with one embodiment of the invention.

For example, FIG. 9A is an illustration of a perspective view representing a top side or a bottom side of a PCB assembly 190 with an application of plating resist exposing a pad 80a, 90b and metalized hole 200 after bonding, and FIG. 9B is a side perspective view of a PCB assembly 190 after bonding. FIG. 9C is a side sectional perspective of the PCB 190 illustrating an application of plating resist 220 with exposing pads 80a, 90b and metalized hole 200 in accordance with one embodiment of the invention. The through holes 200 of the bonded pair PCB 190 are processed with a plating resist 220 exposing the pads 80a, 90b and metalized hole 200 to plating while protecting other elements of the bonded pair (PCB 190) from electroplating.

Figure 10A:
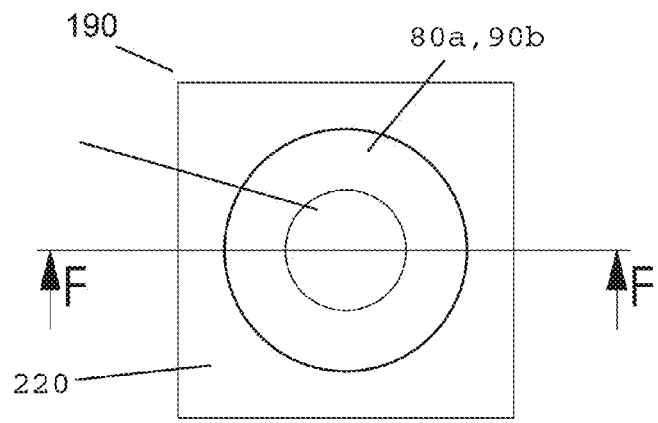
FIG. 10A is an illustration of a perspective view representing a top side or a bottom side of a PCB assembly after bonding including electroplated copper to a pad surface and inside a hole in accordance with one embodiment of the invention.
Figure 10B:
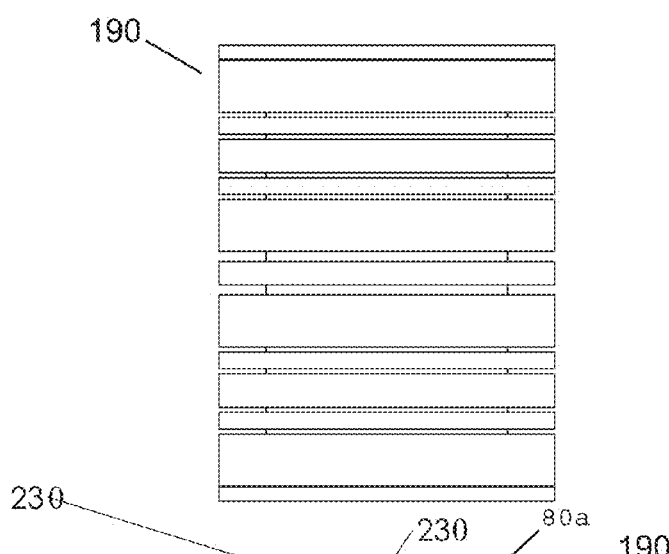
FIG. 10B is a side perspective view of a PCB assembly after bonding including electroplated copper to a pad surface and inside a hole in accordance with one embodiment of the invention.
Figure 10C:
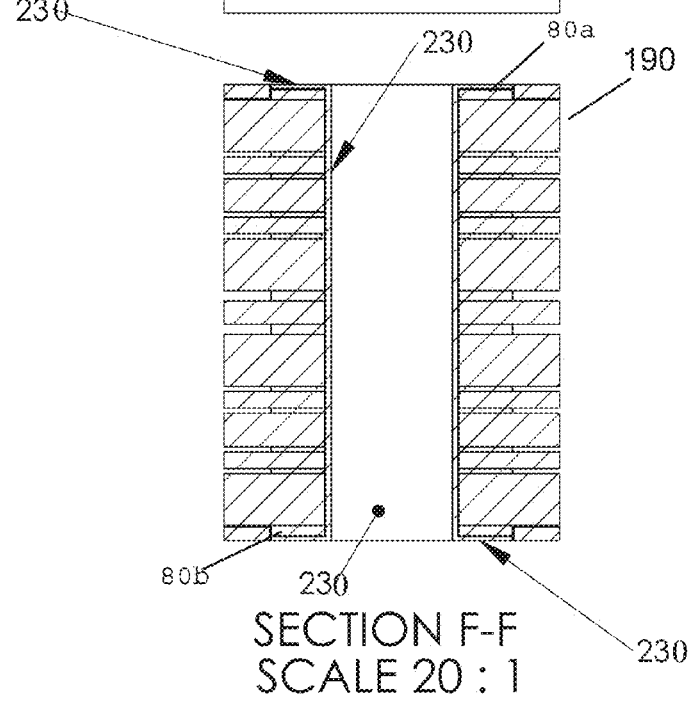
FIG. 10C is a side sectional perspective of a PCB assembly after bonding including electroplated copper to a pad surface and inside a hole in accordance with one embodiment of the invention.

Some embodiments can include a sub-process 360 within the process 5 to allow selective addition of copper to the PCB 190. For example, FIG. 10A is an illustration of a perspective view representing a top side or a bottom side of a PCB assembly 190 after bonding including electroplated copper to a pads 80a, 90b. FIG. 10B is a side perspective view of a PCB assembly 190, and FIG. 10C is a side sectional perspective of a PCB assembly 190 after bonding including electroplated copper 230 to pads 80a, 90b surfaces and inside a hole 200 in accordance with one embodiment of the invention. As shown, in some embodiments, the bonded pair PCB 190 is subjected to a plating process wherein the pad 80a, 90b surfaces and the through holes 200 are electroplated with copper 230. With the plating resist in place, an electrolytic copper plating process can be implemented to provide a thicker deposit of copper. In one embodiment, the copper 230 thickness is in accordance with the specified requirements, which is typically 0.001" minimum. Moreover, the electrolytic copper 230 should conform to the IPC specification of 6012, 6013, and/or 6018. The copper plating 230 provides for a highly reliable continuous connection between inner layers 100 that have been exposed in the drilling process forming hole 200.

Figure 11A:
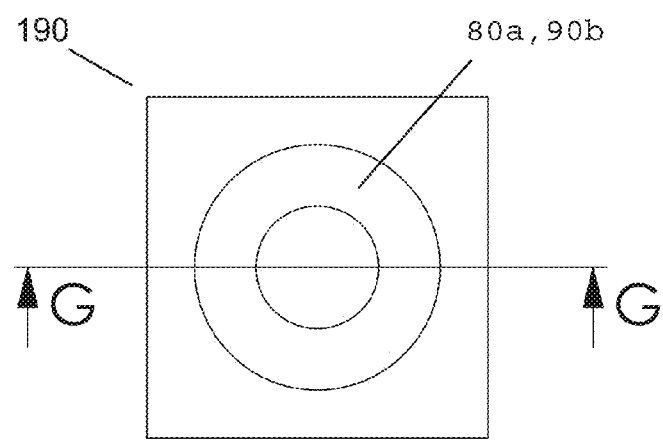
FIG. 11A is an illustration of a perspective view representing a top side or a bottom side of a PCB assembly after bonding after the removal of the plating resist and metalized seed layer that was previously under the plating resist in accordance with one embodiment of the invention.
Figure 11B:
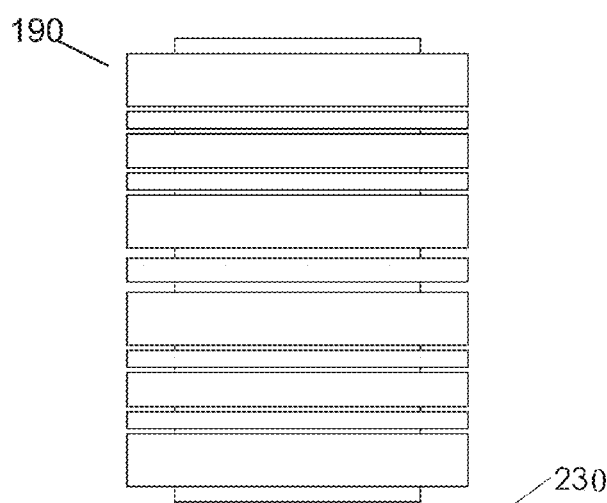
FIG. 11B is a side perspective view of a PCB assembly after bonding after the removal of the plating resist and metalized seed layer that was previously under the plating resist in accordance with one embodiment of the invention.
Figure 11C:
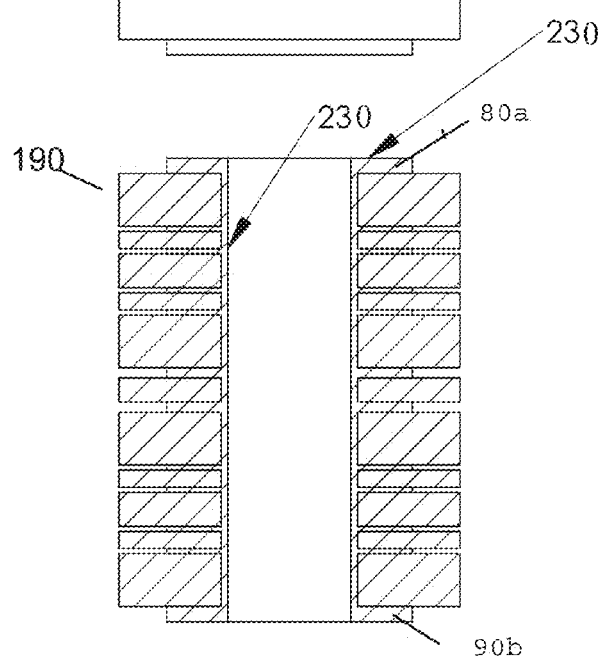
FIG. 11C is a side sectional perspective of a PCB assembly after bonding after the removal of the plating resist and metalized seed layer that was previously under the plating resist in accordance with one embodiment of the invention.
Figure 12:
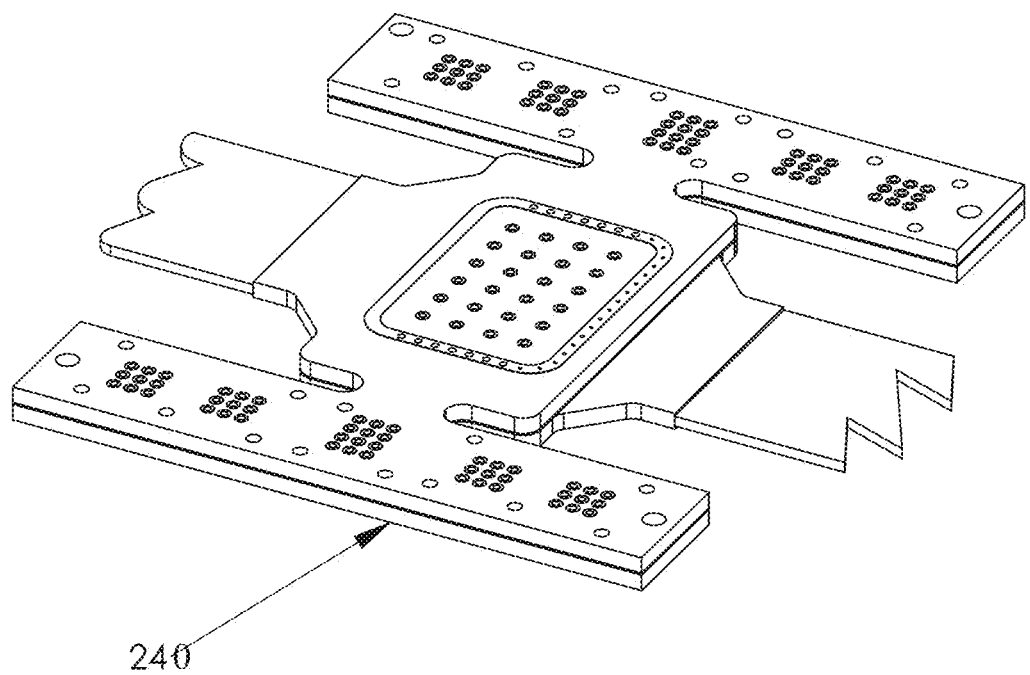
FIG. 12 is a view of a complete bonded pair with all electrical connections top to bottom in accordance with one embodiment of the invention.

In some embodiments, the process 5 can include a sub-process 370 which can encompass removal of the plating resist and metalized seed layer. For example, FIG. 11A is an illustration of a perspective view representing a top side or a bottom side of a PCB assembly 190 after bonding and after the removal of the plating resist and metalized seed layer that was previously under the plating resist in accordance with one embodiment of the invention. Further, FIG. 11B is a side perspective view of a PCB assembly 190, and FIG. 11C is a side sectional perspective of a PCB assembly 190 after bonding after the removal of the plating resist and metalized seed layer that was previously under the plating resist in accordance with one embodiment of the invention. As shown, in one embodiment, the plating resist is removed and the copper is etched off the surface where it is not needed. The surface pads 80a, 90b and inner layer connections 100 are now continuously coupled and isolated. FIG. 12 for example is a view of a complete bonded pair 240 with all electrical connections top to bottom in accordance with one embodiment of the invention.

Figure 13:
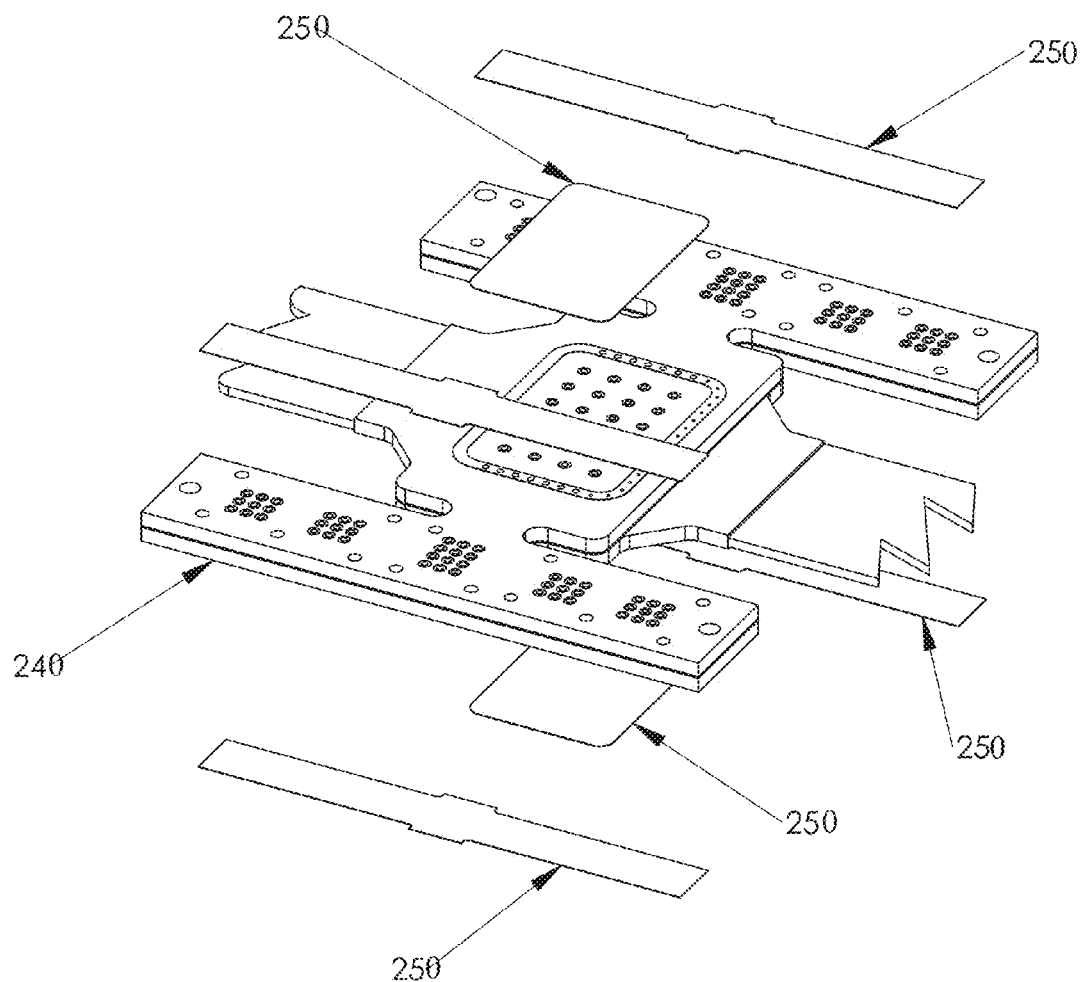
FIG. 13 is an exploded assembly view of an encapsulation of the plated through holes using an non-conductive insulator adhesive in accordance with one embodiment of the invention.
Figure 14:
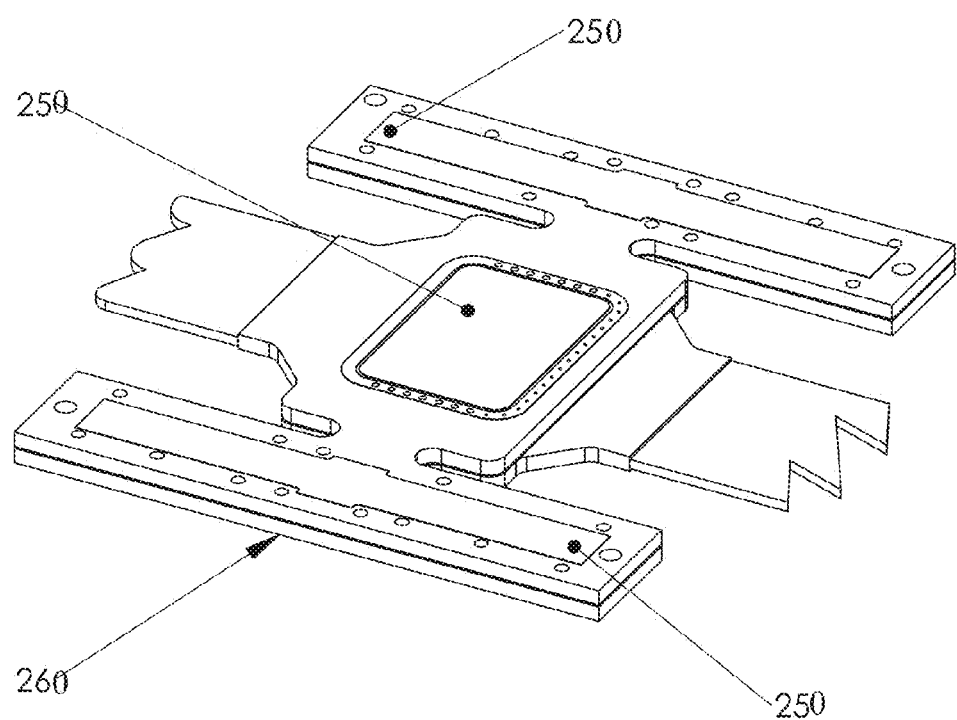
FIG. 14 is a view of a final assembly after insulator application in accordance with one embodiment of the invention.
Figure 15A:
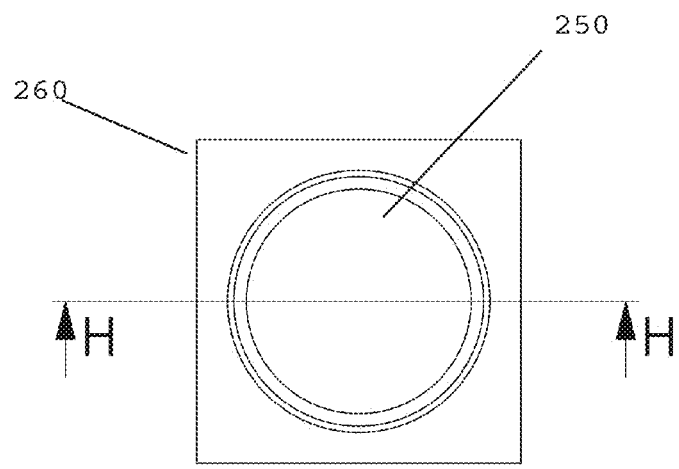
FIG. 15A is an illustration of a perspective view representing a top side or a bottom side of a PCB assembly after bonding following insulator bonding in accordance with one embodiment of the invention.
Figure 15B:
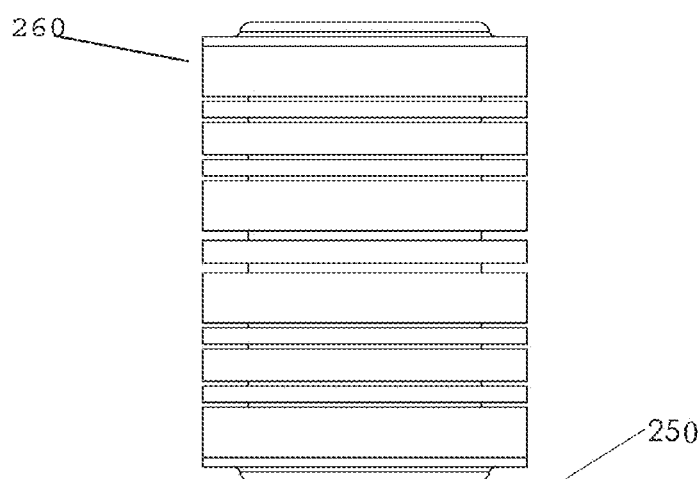
FIG. 15B is a side perspective view of a PCB assembly after bonding following insulator bonding in accordance with one embodiment of the invention.
Figure 15C:
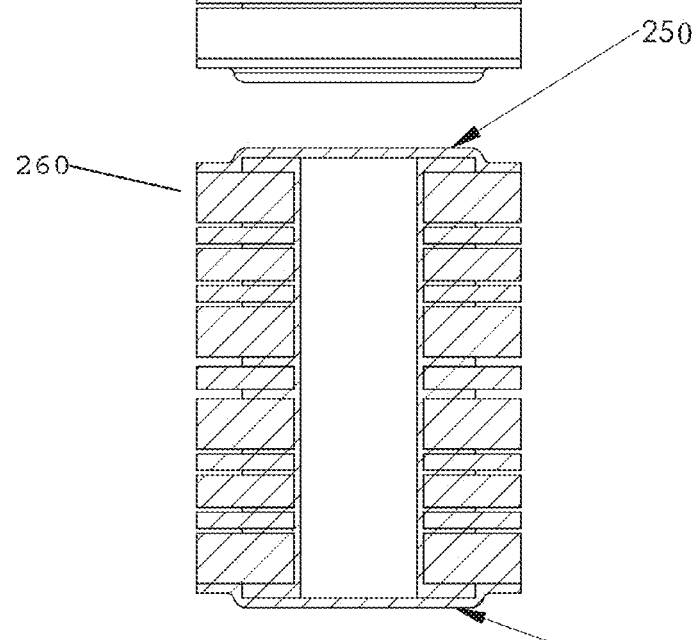
FIG. 15C is a side sectional perspective of a PCB assembly after bonding following insulator bonding in accordance with one embodiment of the invention.

In some embodiments, the process 5 can include a sub-process 380 for applying one or more insulator layers to at least partially electrically insulate one or more electrical connections of the PCB 240. For example, FIG. 13 is an exploded assembly view of an encapsulation of the plated through holes 200 using a non-conductive insulator adhesive 250 in accordance with one embodiment of the invention. In one embodiment, an insulator 250 is provided to the two external surfaces of the PCB 240 encapsulating the plated through-holes 200. In one embodiment, insulator options may include low flow epoxy prepreg, low flow polyimide prepreg, acyclic adhesive with kapton, standard flow prepreg adhesives, to more advance dielectric materials. In some other embodiments, the insulator 250 may be applied as a coating onto the two external surfaces of the PCB 240. For example, some embodiments can utilize a conventional screen printing process, a convention spray process, or a conventional spin-on process to selectively deposit the insulator 250. In one embodiment, and when applicable, a conventional electromagnetic interference shield may be added in addition to the insulator. FIG. 14 is a view of a final assembly after insulator 250 application in accordance with one embodiment of the invention. The final assembly 260 includes the non-conductive insulator adhesive 250 that was applied in the previous step described in reference to FIG. 13. Further, FIG. 15A is an illustration of a perspective view representing a top side or a bottom side of a PCB assembly 260 after bonding following insulator bonding described above in accordance with one embodiment of the invention. FIG. 15B is a side perspective view of a PCB assembly 260, and FIG. 15C is a side sectional perspective of a PCB assembly 260 following insulator bonding in accordance with one embodiment of the invention. As shown, following completion of sub-process 380, the PCB 260 can include an insulator 250 region at least partially covering the rigid regions 40 (covering the through-hole region 50, and excluding the, ground ring 60), and the conformance coupon through-holes 70.

Figure 16:
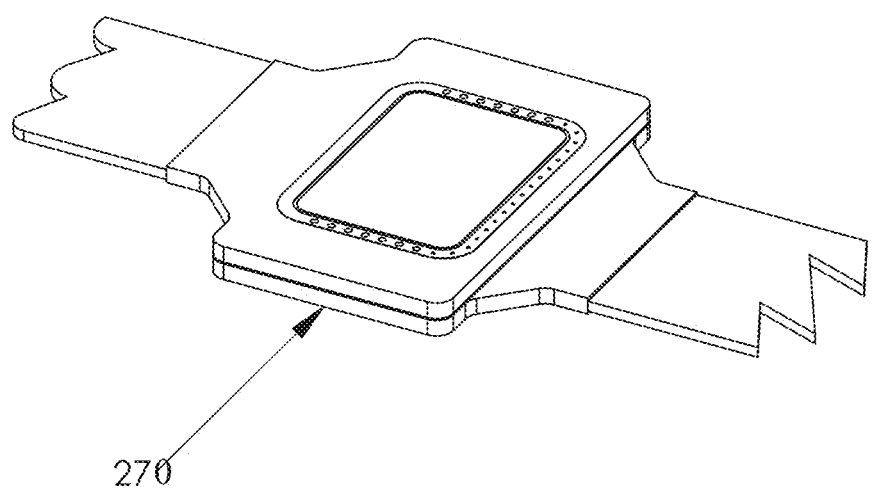
FIG. 16 is a view of a removal of the Process Verification coupons and final routing of the bonded area per required dimensions in accordance with one embodiment of the invention.

In some embodiments, the process 5 can include a sub-process 390 to remove the alignment holes 10 (including the coupon 20). In one embodiment, the alignment holes 10 and process verification coupons 20 may be removed. The process steps that are performed in the bonded pair are simultaneously performed on the coupons 20. Coupons 20 may be micro-sectioned for process and product verification to application specific and/or conformance specification such as IPC specification 6012, 6013, and/or 6018 class 3. For example, FIG. 16 is a view of a removal of the process verification coupons 20, providing a final PCB 270, and illustrating the final routing of the bonded area in accordance with one embodiment of the invention.

In some embodiments, the process 5 can include a sub-process 400. For example, in some embodiments, the bonded PCB 270 is electrically tested. For example, in one other embodiment, the PCB 270 may be tested for isolation and continuity in accordance to end applications requirements, IPC 9252 performance specification, and/or any other defined requirements.

Practitioners will appreciate that many of the steps disclosed above are particularly relevant to the PCB manufacturing process. As such, not every required processing step has been described. For example, one of ordinary skill in the art would appreciate the relevance of the application of photo resist to the etching and electroplating processes. Moreover, such processes may be facilitated through an implementation of multiple methodologies while creating a similar end result. It is beyond the scope of this disclosure to describe the specific methodologies and the potential benefits of implementing one process over another.

It will be appreciated by those skilled in the art that while the invention has been described above in connection with particular embodiments and examples, the invention is not necessarily so limited, and that numerous other embodiments, examples, uses, modifications and departures from the embodiments, examples and uses are intended to be encompassed by the claims attached hereto. The entire disclosure of each patent and publication cited herein is incorporated by reference, as if each such patent or publication were individually incorporated by reference herein. Various features and advantages of the invention are set forth in the following claims.

The invention claimed is:

1. A method of fabricating a printed circuit board interconnect assembly, comprising:
    aligning and stacking a plurality of printed circuit boards with at least one adhesive component, each of the plurality of circuit boards including at least one tooling alignment hole,
    the at least one adhesive component being pre-cut and comprising a first side and a second side and at least one tooled alignment hole;
    laminating the printed circuit boards and the adhesive component so that the first side is interfaced with one of the plurality of printed circuit boards and the second side is interfaced to another of the plurality of printed circuit boards, and
    wherein the at least one tooling alignment hole corresponds to the position of the at least one tooled alignment hole;
    after laminating, preparing bonded pair holes;
    after preparing, depositing a copper seed layer;
    after depositing, creating at least one plate resist layer;
    after creating, forming a copper plate image;
    after forming, electroplating a copper layer;
    after electroplating, removing the at least one plate resist layer; and
    depositing an insulator layer after plate resist removal, resulting in the printed circuit board interconnect assembly.

* * * * *